US012751253B2

(12) United States Patent
Lee et al.

(10) Patent No.: US 12,751,253 B2
(45) Date of Patent: Sep. 29, 2026

(54) CYLINDRIC DECOMPOSITION FOR EFFICIENT MITIGATION OF SUBSTRATE DEFORMATION WITH FILM DEPOSITION AND ION IMPLANTATION

(71) Applicant: Applied Materials, Inc., Santa Clara, CA (US)

(72) Inventors: Wonjae Lee, Fremont, CA (US); Pradeep Kumar Subrahmanyan, San Jose, CA (US); D. Jeffrey Lischer, Acton, MA (US); Frank Sinclair, Hartland, ME (US)

(73) Assignee: Applied Materials, Inc., Santa Clara, CA (US)

( * ) Notice: Subject to any disclaimer, the term of this patent is extended or adjusted under 35 U.S.C. 154(b) by 253 days.

(21) Appl. No.: 18/431,909

(22) Filed: Feb. 2, 2024

(65) Prior Publication Data

US 2024/0266231 A1 Aug. 8, 2024

Related U.S. Application Data

(60) Provisional application No. 63/511,414, filed on Jun. 30, 2023, provisional application No. 63/502,452, (Continued)

(51) Int. Cl.
*H10P 74/20* (2026.01)
*C23C 14/48* (2006.01)
(Continued)

(52) U.S. Cl.
CPC ............ *H10P 74/203* (2026.01); *C23C 14/48* (2013.01); *C23C 14/54* (2013.01); *C23C 14/547* (2013.01);
(Continued)

(58) Field of Classification Search
CPC ........ H10P 74/23; H10P 74/203; H10P 30/20; H10P 30/40; H10P 14/6518;
(Continued)

(56) References Cited

U.S. PATENT DOCUMENTS

| | | | | |
|---|---|---|---|---|
| 10,754,319 | B1 | 8/2020 | Good et al. | |
| 2005/0278126 | A1 * | 12/2005 | Rosakis | G01L 1/24 702/42 |

(Continued)

FOREIGN PATENT DOCUMENTS

| | | | |
|---|---|---|---|
| CN | 113594309 | A | 11/2021 |
| JP | 2001068429 | A | 3/2001 |

(Continued)

OTHER PUBLICATIONS

International Search Report and Written Opinion for International Application No. PCT/US2024/014670, mailed Jun. 10, 2024, 8 Pages.

(Continued)

*Primary Examiner* — Orlando Bousono
(74) *Attorney, Agent, or Firm* — Lowenstein Sandler LLP

(57) ABSTRACT

Disclosed systems and techniques are directed to correct an out-of-plane deformation (OPD) of a substrate. The techniques include obtaining, using optical inspection data, an OPD profile of the substrate and obtaining a polynomial representation of the OPD profile to determine a plurality of polynomial coefficients characterizing respective elemental deformation shapes of the substrate. The techniques further include identifying one or more cylindric decompositions of a quadratic part of the OPD profile and computing, using a selected cylindric decomposition of the one or more cylindric decompositions, one or more characteristics of a stress-compensation layer (SCL) for the substrate. The techniques further include causing the SCL to be deposited on the (Continued)

substrate and the SCL to be exposed to a stress-mitigation beam.

20 Claims, 9 Drawing Sheets

Related U.S. Application Data filed on May 16, 2023, provisional application No. 63/502,447, filed on May 16, 2023, provisional application No. 63/502,448, filed on May 16, 2023, provisional application No. 63/491,170, filed on Mar. 20, 2023, provisional application No. 63/444,158, filed on Feb. 8, 2023.

(51) Int. Cl.

| | |
|---|---|
| ***C23C 14/54*** | (2006.01) |
| ***G01B 9/02*** | (2022.01) |
| ***G01B 11/16*** | (2006.01) |
| ***H10P 14/60*** | (2026.01) |
| ***H10P 30/20*** | (2026.01) |
| ***H10P 30/40*** | (2026.01) |
| ***H10P 72/00*** | (2026.01) |
| ***H10P 74/00*** | (2026.01) |
| ***H10W 42/00*** | (2026.01) |
| *H10P 14/694* | (2026.01) |

(52) U.S. Cl.

CPC .......... *G01B 9/02095* (2013.01); *G01B 11/16* (2013.01); *G01B 11/162* (2013.01); *H10P 14/6518* (2026.01); *H10P 14/6539* (2026.01); *H10P 30/20* (2026.01); *H10P 30/40* (2026.01); *H10P 72/0616* (2026.01); *H10P 74/23* (2026.01); *H10W 42/121* (2026.01); *H10P 14/69433* (2026.01)

(58) Field of Classification Search

CPC ........... H10P 14/6539; H10P 14/69433; H10P 72/0616; H10W 42/121; C23C 14/48; C23C 14/54; C23C 14/547; G01B 9/02095; G01B 11/16; G01B 11/162

See application file for complete search history.

(56) References Cited

U.S. PATENT DOCUMENTS

| | | | | |
|---|---|---|---|---|
| 2006/0123919 | A1* | 6/2006 | Lovell | G01L 5/0047 73/788 |
| 2006/0276977 | A1* | 12/2006 | Rosakis | G01L 5/0047 702/42 |
| 2007/0180919 | A1* | 8/2007 | Rosakis | G01L 5/0047 702/127 |
| 2016/0005662 | A1 | 1/2016 | Yieh et al. | |
| 2017/0125268 | A1 | 5/2017 | Dang et al. | |
| 2017/0162522 | A1 | 6/2017 | Chang et al. | |
| 2017/0178891 | A1 | 6/2017 | Batinica et al. | |
| 2017/0287752 | A1 | 10/2017 | Godet et al. | |
| 2018/0329310 | A1 | 11/2018 | Coskun et al. | |
| 2019/0041758 | A1 | 2/2019 | Van Dijk et al. | |
| 2019/0287854 | A1 | 9/2019 | Miller et al. | |
| 2019/0378737 | A1 | 12/2019 | Gutman et al. | |
| 2021/0047729 | A1* | 2/2021 | Yao | C23C 16/4407 |
| 2021/0050411 | A1 | 2/2021 | Zhang et al. | |
| 2021/0247701 | A1* | 8/2021 | Li | G03F 7/70725 |
| 2022/0068648 | A1 | 3/2022 | Falk et al. | |
| 2022/0344171 | A1 | 10/2022 | Varghese et al. | |
| 2022/0344282 | A1 | 10/2022 | Subrahmanyan et al. | |

FOREIGN PATENT DOCUMENTS

| | | | |
|---|---|---|---|
| JP | 2020148865 | A | 9/2020 |
| KR | 20180021133 | A | 2/2018 |
| WO | 2017038026 | A1 | 3/2017 |
| WO | 2022119732 | A1 | 6/2022 |

OTHER PUBLICATIONS

International Search Report and Written Opinion for International Application No. PCT/US2024/014674, mailed Jun. 10, 2024, 9 Pages.

International Search Report and Written Opinion for International Application No. PCT/US2024/014676, mailed Jun. 10, 2024, 10 Pages.

International Search Report and Written Opinion for International Application No. PCT/US2024/014884, mailed May 27, 2024, 08 Pages.

International Search Report and Written Opinion for International Application No. PCT/US2024/014939, mailed Jun. 14, 2024, 09 Pages.

* cited by examiner

CYLINDRIC DECOMPOSITION FOR EFFICIENT MITIGATION OF SUBSTRATE DEFORMATION WITH FILM DEPOSITION AND ION IMPLANTATION

RELATED APPLICATIONS

This application claims the benefit of U.S. Provisional Patent Application No. 63/444,158, filed Feb. 8, 2023, entitled "Mitigation of stress and deformation in wafers"; U.S. Provisional Patent Application No. 63/491,170, filed Mar. 20, 2023, entitled "Optimized film deposition and ion implantation for mitigation of stress and deformation in wafers"; U.S. Provisional Patent Application No. 63/502,447, filed May 16, 2023, entitled "Mitigation of saddle deformation of wafers using film deposition and edge ion implantation"; U.S. Provisional Patent Application No. 63/502,448, filed May 16, 2023, entitled "Influence function-based mitigation of wafer deformation with film deposition and ion implantation"; U.S. Provisional Patent Application No. 63/502,452, filed May 16, 2023, entitled "Cylindric decomposition for efficient mitigation of wafer deformation with film deposition and ion implantation"; and U.S. Provisional Patent Application No. 63/511,414, filed Jun. 30, 2023, entitled "Wafer stress management for precise wafer-to-wafer bonding," the contents of which are incorporated by reference in their entirety herein.

TECHNICAL FIELD

The disclosure pertains to semiconductor manufacturing, including manufacturing of wafers.

BACKGROUND

Modern semiconducting devices, such as processing circuits, memory devices, light detectors, solar cells, light-emitting semiconductor devices, and the like, are often manufactured on silicon wafers (or other suitable substrates). Wafers may undergo numerous processing operations, such as physical vapor deposition, chemical vapor deposition, etching, photo-masking, polishing, and/or various other operations. In a continuous effort to reduce the cost of semiconductor devices, multi-layer stacks of dies, insulating films, patterned and/or doped semiconducting films, and/or other features are often deposited on a single wafer, resulting in high aspect ratio devices, which are used, e.g., in 3D flash memory devices and other applications. Deposition, patterning, etching, polishing, etc., of stacks of multi-layered structures often result in significant stresses applied to the underlying wafers. Such stresses lead to both an out-of-plane distortion and an in-plane distortion of features supported by the wafers. These distortions result in misalignment of deposited features and can significantly degrade quality of manufactured devices.

BRIEF DESCRIPTION OF THE DRAWINGS

The present disclosure will be understood more fully from the detailed description given below and from the accompanying drawings of various embodiments of the disclosure.

SUMMARY

Figure 1A:
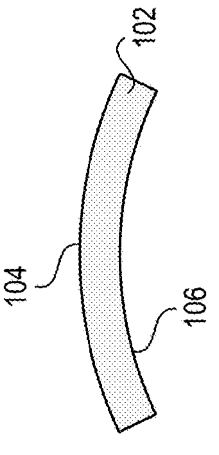
FIGS. 1A-E illustrate schematically a process of stress-correcting the back side-deposited film with an additional ion implantation, according to at least one embodiment.

In one embodiment, disclosed is a method to correct an out-of-plane deformation of a substrate, including obtaining, using optical inspection data, an OPD profile of the substrate. The method further includes performing a polynomial representation of the OPD profile to determine a plurality of polynomial coefficients, each of the plurality of polynomial coefficients characterizing a respective one of a plurality of elemental deformation shapes of the substrate. The method further includes identifying, based on at least a subset of the plurality of polynomial coefficients, one or more cylindric decompositions of a quadratic part of the OPD profile, wherein each of the one or more cylindric decompositions comprises a decomposition of the OPD profile into at least a parabolic deformation of the substrate and a cylindric deformation of the substrate. The method further includes computing, using a selected cylindric decomposition of the one or more cylindric decompositions, one or more characteristics of a stress-compensation layer (SCL) for the substrate. The method further includes causing the SCL to be deposited on the substrate and exposing the SCL to a stress-mitigation beam.

In another embodiment, disclosed is a system that includes a memory and a processing device communicatively coupled to the memory to obtain, using optical inspection data, an out-of-plane deformation profile (OPD profile) of a substrate. The processing device is further to perform a polynomial representation of the OPD profile to determine a plurality of polynomial coefficients, each of the plurality of polynomial coefficients characterizing a respective one of a plurality of elemental deformation shapes of the substrate. The processing device is further to identify, based on at least a subset of the plurality of polynomial coefficients, one or more cylindric decompositions of a quadratic part of the OPD profile, wherein each of the one or more cylindric decompositions comprises a decomposition of the OPD profile into at least a parabolic deformation of the substrate and a cylindric deformation of the substrate. The processing device is further to compute, using a selected cylindric decomposition of the one or more cylindric decompositions, one or more characteristics of a stress-compensation layer (SCL) for the substrate. The processing device is further to cause the SCL to be deposited on the substrate and the SCL to be exposed to a stress-mitigation beam.

In another embodiment, disclosed is a semiconductor manufacturing system that includes one or more processing chambers to process a substrate and a computing device. The computing device is to obtain, using optical inspection data, an OPD profile of the substrate and obtain a polynomial representation of the OPD profile to determine a plurality of polynomial coefficients, each of the plurality of polynomial coefficients characterizing a respective one of a plurality of elemental deformation shapes of the substrate. The computing device is to identify, based on at least a subset of the plurality of polynomial coefficients, one or more cylindric decompositions of a quadratic part of the OPD profile, wherein each of the one or more cylindric decompositions comprises a decomposition of the OPD profile into at least a parabolic deformation of the substrate and a cylindric deformation of the substrate. The computing device is to compute, using a selected cylindric decomposition of the one or more cylindric decompositions, one or more characteristics of a stress-compensation layer (SCL) for the substrate, cause the SCL to be deposited on the substrate, and casing the SCL to be exposed to a stress-mitigation beam.

In yet another embodiment, disclosed is a non-transitory computer-readable memory storing instructions thereon that, when executed by a processing device, cause the processing device to perform operations that include obtaining, using optical inspection data, an out-of-plane deformation profile (OPD profile) of a substrate. The operations further include performing a polynomial representation of the OPD profile to determine a plurality of polynomial coefficients, each of the plurality of polynomial coefficients characterizing a respective one of a plurality of elemental deformation shapes of the substrate. The operations further include identifying, based on at least a subset of the plurality of polynomial coefficients, one or more cylindric decompositions of a quadratic part of the OPD profile, wherein each of the one or more cylindric decompositions comprises a decomposition of the OPD profile into at least a parabolic deformation of the substrate and a cylindric deformation of the substrate. The operations further include computing, using a selected cylindric decomposition of the one or more cylindric decompositions, one or more characteristics of a stress-compensation layer (SCL) for the substrate. The operations further include causing the SCL to be deposited on the substrate and exposing the SCL to a stress-mitigation beam.

DETAILED DESCRIPTION

Existing technology includes a number of methods to address wafer deformation. For example, a deformed (warped) wafer with various films and features deposited on one side (referred to as the front side, top side, or main side herein) can be coated on the other side (referred to as the back side or bottom side herein) with a film that exerts a compressive stress or tensile stress on the wafer. Such back side-deposited deformation-correcting film, also referred to as a stress-compensation layer or film herein, usually imparts a uniform (or global) stress to the entire wafer and cannot compensate for local stress modulation and/or anisotropic stress. Additional correction can be achieved by implanting ions into the stress-compensation layer, e.g., using a beam of ions to bombard the stress-compensation layer, to adjust the stress in the stress-compensation layer and, consequently, to further mitigate the deformation of the underlying wafer.

A "wafer," as used herein, refers to any substrate or material surface formed on a substrate upon which film processing is performed during a fabrication process. For example, a wafer surface on which processing can be performed includes materials such as silicon, silicon oxide, silicon nitride, strained silicon, silicon on insulator, carbon doped silicon oxides, amorphous silicon, doped silicon, germanium, gallium arsenide, glass, sapphire, and any other materials such as metals, metal nitrides, metal alloys, and other conductive materials, depending on the application. Wafers include, without limitation, semiconductor wafers. In some instances, wafers can include plastic substrates. Wafers may be exposed to a pretreatment process to polish, etch, reduce, oxidize, hydroxylate, anneal, UV cure, e-beam cure and/or bake the substrate surface. In addition to film processing directly on the surface of the wafer itself, any of the film processing steps disclosed may also be performed on an underlayer formed on the wafer as disclosed in more detail below, and the term "wafer surface" is intended to include such underlayer as the context indicates. Thus, for example, where a film/layer or partial film/layer has been deposited onto a wafer surface, the exposed surface of the newly deposited film/layer becomes the wafer surface. In some embodiments, wafers have a thickness in the range of 0.25 mm to 1.5 mm, or in the range of 0.5 mm to 1.25 mm, in the range of 0.75 mm to 1.0 mm, or more. In some embodiments, wafers have a diameter of about 10 cm, 20 cm, 30 cm, or more.

Figure 5:
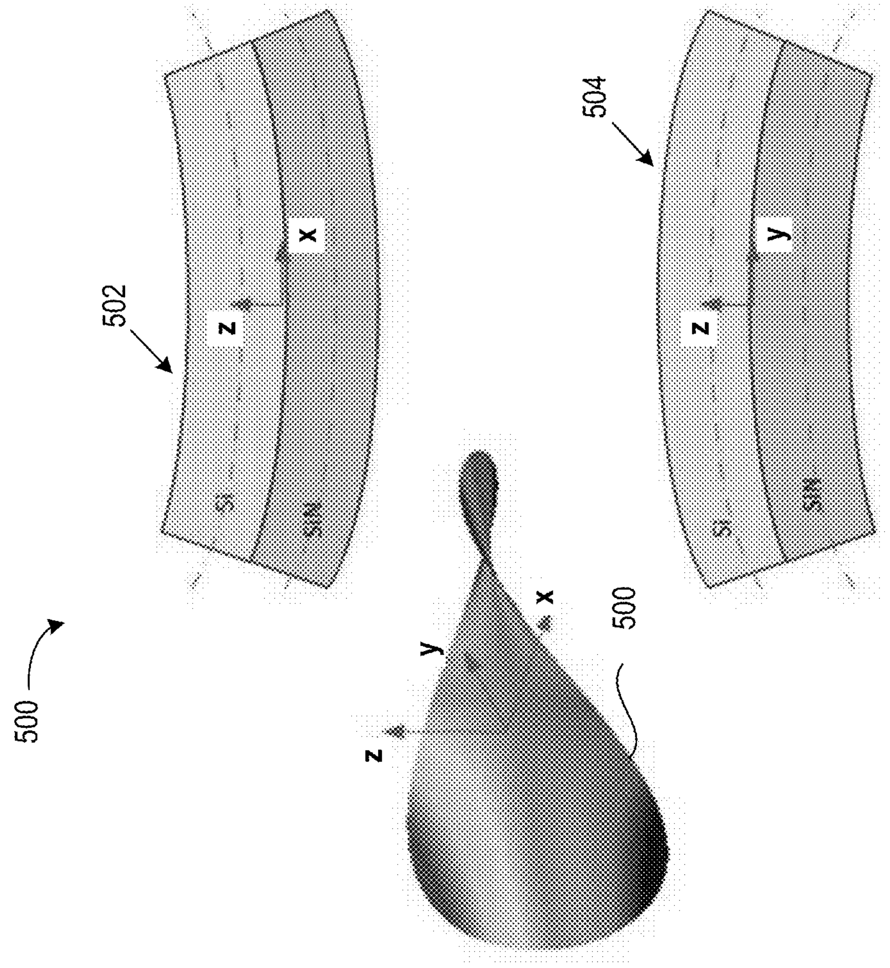
FIG. 5 illustrates an example silicon wafer with a Silicon Nitride film deposited thereon having a saddle-shaped deformation, according to at least one embodiment.

Deposition of stress-compensation layers in conjunction with ion implantation can be quite efficient in correcting stresses that are uniform and isotropic, $\sigma_{xx}\approx\sigma_{yy}$. On the other hand, mitigating stresses that vary with location x, y on the wafer, $\sigma_{jk}$ (x,y), stresses that are anisotropic, $\sigma_{xx}\neq\sigma_{yy}$, or both is a much more challenging problem. Certain feature patterns can result in stresses that are compressive along one direction, e.g., $\sigma_{xx}<0$, and tensile along a perpendicular direction, $\sigma_{yy}>0$, resulting in saddle-shaped wafers, e.g., as illustrated in FIG. 5. Such saddle-shaped features can arise, for example, in stacks of materials with directional patterning, e.g., patterning of wordlines in flash memory devices. Correcting such anisotropic saddle deformations in wafers remains a difficult task.

Aspects and embodiments of the present disclosure address these and other challenges of the modern semiconductor manufacturing technology by providing for systems and techniques that can efficiently mitigate non-uniform and/or anisotropic stresses and deformations of wafers. A wafer deformation $h(r,\phi)=h_{quad}(r, \phi)+h_{res}(r, \phi)$ can be represented (decomposed) as a combination of a quadratic $h_{quad}(r, \phi)$ and residual (non-quadratic) $h_{res}(r, \phi)$ contributions. The quadratic deformation can include a parabolic (paraboloid) part $h_{par}(r)$, which has the complete axial symmetry, and a saddle part $h_{saddle}(r, \phi)$, which has discrete symmetries that include the 180-degree rotations and the mirror symmetries with respect to reflections in two perpendicular planes. The parabolic deformation $h_{par}(r)=Ar^2$ has a uniform (position-independent) axisymmetric strain tensor $$(u_{par})_{rr} = -z\frac{\partial^2 h}{\partial r^2} = AD,\ (u_{par})_{\phi\phi} = -z\frac{1}{r}\frac{\partial h}{\partial r} = AD,$$

where z is the vertical coordinate of a location inside the wafer where the stress is being specified. For an unpatterned back side of the wafer, the vertical coordinate is taken to be z=−D/2, where D is the thickness of the wafer. The corresponding strain tensor of the parabolic deformation is also likewise, per Hooke's law, $$(\sigma_{par})_{rr} = (\sigma_{par})_{\phi\phi} = \frac{E(1-\nu)AD}{2(1+\nu)(1-2\nu)},$$

where E and ν are, respectively, Young's modulus and Poisson's ratio of a wafer material. The uniform strain associated with the parabolic deformation can be compensated by depositing a stress-compensation film of a uniform thickness d that exerts, on the back side of the film, a stress that is equal and opposite to the parabolic stress of the wafer. The thickness of the film d can be computed (or empirically determined) in such a way that the film is to apply a desired target stress to the back side of the wafer. For example, if A>0, the parabolic bow of the wafer is bent upwards resulting in compression of the wafer's top side and stretching of its back side. Correspondingly, a film that exerts a compressive stress on the wafer can be deposited on the wafer's back side to reduce (or eliminate) stretching of the wafer's back side. Conversely, if A<0, the back side of the wafer is compressed and a film that exerts a tensile stress on the wafer's back side can be used to reduce (or eliminate) stretching of the back side.

Saddle deformation and stresses are non-uniform and change sign four times around the wafer's circumference, e.g., $\sigma_{jk} \propto \cos(2\phi)$, and therefore cannot be eliminated by depositing a stress-compensation film alone. In some embodiments, the stress-compensation film can be of such thickness and material as to not only eliminate the parabolic bow, but also to turn the saddle deformation into a cylindric deformation that has a definite sign throughout the whole area of the wafer. The uniform-sign cylindric deformation (as well as a residual higher-order non-quadratic deformation) can then be mitigated with ion implantation into the film. As provided for in the instant disclosure, identification of suitable stress-compensation films is enabled by decomposing a quadratic deformation into a parabolic component and a cylindric component. As disclosed in more detail below, such a decomposition is not unique, as the resulting cylindric deformation can be selected either positive (upward-facing) or negative (downward-facing). Identifying both such decompositions enables one to select the more effective decomposition for subsequent film deposition and ion implantation.

In one embodiment, a vertical profile of wafer deformation z=h(r, ϕ) can be measured using optical metrology techniques. For example, an interferogram of the profile h(r, ϕ) can be obtained using optical interferometry measurements. The wafer profile h(r, ϕ) can then be represented via a number of parameters that qualitatively and quantitatively characterize geometry of the wafer deformation. In some embodiments, a set of Zernike (or a similar set of) polynomials may be used to represent the wafer profile, $$h(r,\phi) = \sum_j A_j Z_j(r,\phi),$$

where r is the radial coordinate and ϕ is the polar angle coordinate within the (average) plane of the wafer. Consecutive coefficients $A_1$, $A_2$, $A_3$, $A_4$ . . . represent weights of specific geometric features (elemental deformations) of the wafer described by the corresponding Zernike polynomials $Z_1(r, \phi)$, $Z_2(r, \phi)$, $Z_3(r, \phi)$, $Z_4(r, \phi)$ . . . . The first three coefficients are of less interest as they describe a uniform shift of the wafer (coefficient $A_1$, associated with the $Z_1(r, \phi)=1$ polynomial), a deformation-free x-tilt that amounts to a rotation around the y-axis (coefficient $A_2$, associated with the $Z_2(r, \phi)=2r \cos \phi$ polynomial), and a deformation-free x-tilt that amounts to a rotation around the x-axis (coefficient $A_3$, associated with the $Z_3(r, \phi)=2r \sin \phi$ polynomial) that can be eliminated by a realignment of the coordinate axes. (Herein, in the Noll indexing scheme for the Zernike polynomials is being used.) The fourth coefficient $A_4$ is associated with $Z_4(r, \phi)=\sqrt{3}\,(2r^2-1)$ and characterizes an isotropic paraboloid deformation ("bow"). The fifth $A_5$ and the sixth $A_6$ coefficients are associated with $Z_5(r, \phi)=\sqrt{6}\, r^2 \sin 20$ and $Z_6(r, \phi)=\sqrt{6}\, r^2 \cos 2\phi$ polynomials, respectively, and characterize a saddle-type deformation. The $A_5$ coefficient characterizes a saddle shape that curves up ($A_5>0$) or down ($A_5<0$) along the diagonal y=x and curves down ($A_5>0$) or up ($A_5<0$) along the diagonal y=−x. The $A_6$ coefficient characterizes a saddle shape that curves up ($A_6>0$) or down ($A_6<0$) along the x-axis and curves down ($A_6>0$) or up ($A_6<0$) along the y-axis. The higher coefficients $A_7$, $A_8$, etc., characterize progressively faster variations of the wafer deformation h(r, ϕ) along the radial direction, along the azimuthal direction, or both and collectively represent a residual deformation, $$h_{res}(r,\phi) = h(r,\phi) - \sum_{j=4}^{6} A_j Z_j(r,\phi).$$

Figure 2:
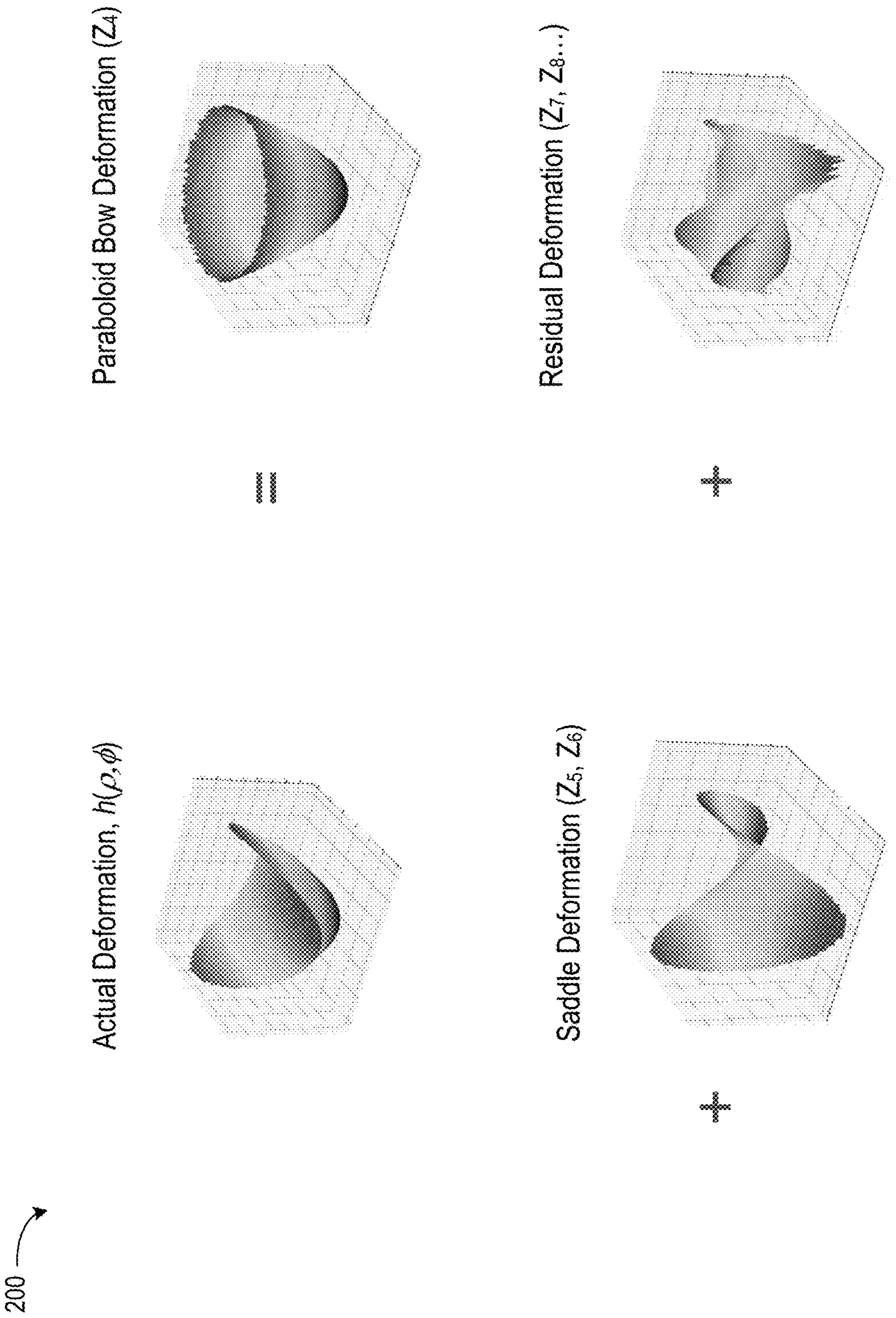
FIG. 2 illustrates an example Zernike polynomial decomposition of one actual deformation (top left) of a wafer, in arbitrary units, into a paraboloid bow deformation (top right), a saddle deformation (bottom left), and a residual deformation (bottom right), according to at least one embodiment.

FIG. 2 illustrates an example Zernike polynomial decomposition 200 of one actual deformation h(r, ϕ) (top left) of a wafer, in arbitrary units, into a paraboloid bow deformation $A_4Z_4(r, \phi)$ (top right), a saddle deformation $A_5Z_5(r, \phi)+A_6Z_6(r, \phi)$ (bottom left), and a residual deformation, $h_{res}(r, \phi)$ (bottom right), according to at least one embodiment.

Figure 1B:
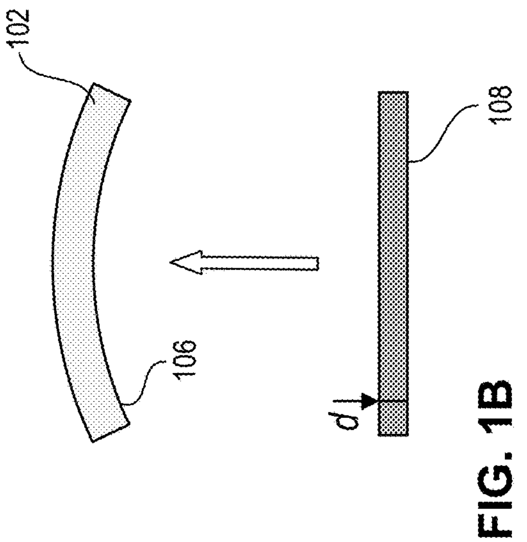

In some embodiments, selection of a thickness d of the stress-compensation film can be made based on a value of the paraboloid bow coefficient $A_4$. FIGS. 1A-E illustrate schematically a process of stress-correcting the back side-deposited film with an additional ion implantation, according to at least one embodiment. FIG. 1A depicts a wafer 102 having a deformation, which can include a paraboloid bow deformation (with negative coefficient $A^4<0$) and other deformations, e.g., a saddle deformation and a residual deformations (both not shown in FIGS. 1A-E for conciseness and ease of viewing). Wafer 102 has a front side 104 and a back side 106. Any number of features (e.g., deposition and/or etching patterns), dies, photo-masks, and/or any other structures can be deposited on or etched in the front side 104. In some embodiments, back side 106 can be free from deposited/etched features/structures. In some embodiments, back side 106 can also have one or more deposited/etched features/structures. FIG. 1B illustrates schematically deposition of a stress-compensation layer on the back side of wafer 102. In some embodiments, stress-compensation layer 108 can include one or more films of different materials. Individual films may have a thickness in the range of 10 nm to 200 nm, or in the range of 20 nm to 180 nm, or in the range of 30 nm to 160 nm, or in the range of 40 nm to 140 nm, or more. A total thickness of the stress-compensating layer may be up to several microns or even more. In some embodiments, stress-compensation layer 108 is deposited at a temperature in the range of 100° ° C. to 500° C. or higher.

Figure 1C:
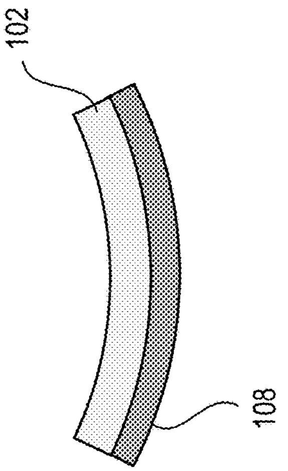

A material (type) of stress-compensation layer 108 can be selected based on the sign of coefficient $A_4$. For example, for a negative bow, $A_4<0$, and stress-compensation layer 108 may be selected to have a tensile stress (as illustrated in FIGS. 1A-E). For silicon wafers, such a film can be a silicon nitride ($Si_3N_4$) film. Conversely, for a positive bow, $A_4>0$, and stress-compensation layer 108 may be selected to have a tensile stress (not shown in FIGS. 1A-E). Stress-compensation layer 108 can be deposited using any suitable deposition techniques including physical vapor deposition (e.g., sputtering), chemical vapor deposition (e.g., plasma-assisted deposition), epitaxy, exfoliation, and/or the like. Deposition can be performed at room temperature or at temperatures different from room temperature (e.g., at an elevated temperature). In some embodiments, a thickness d of stress-compensation layer 108 can be selected to overcorrect the deformation to some degree, e.g., as illustrated in FIG. 1C where a negative paraboloid bow becomes a positive paraboloid bow. The thickness-dependent paraboloid bow correction $A_{corr}(d)$ changes wafer deformation from $h(r, \phi)$ to $h_{corr}(r, \phi)$:

$$h_{corr}(r, \phi) = h(r, \phi) + A_{corr}(d) \cdot Z_4(r, \phi).$$

Figure 1D:
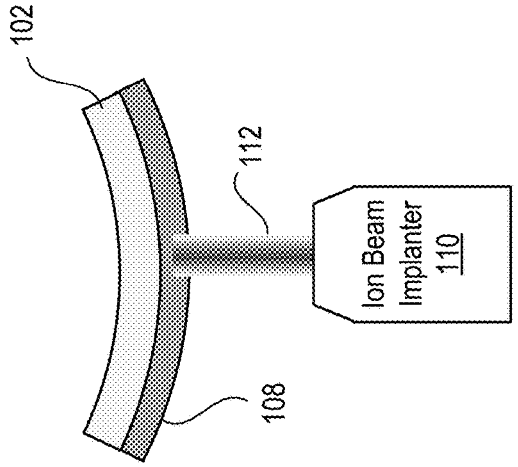

The overcorrection is chosen in conjunction with the implant species, energy, and dose to ensure maximum entitlement from the stress compensation. The overcorrection makes the combined structure of wafer 102 and stress-compensation layer 108 susceptible to further control of stress (and thus deformation of the wafer $h_{corr}(r, \phi)$). As illustrated in FIG. 1D, an ion beam implanter 110 can generate an ion beam 112 that strikes stress-compensation layer 108 and deposits ions therein. Ion beam 112 can carry silicon ions, phosphorus ions, argon ions, neon ions, xenon ions, krypton ions, and/or the like. In some embodiments, the energy and type of ions in ion beam 112 can be selected to limit the implanted ions to the volume of stress-compensation layer 108 without allowing the ions to reach wafer 102. Ions that lodge in stress-compensation layer 108 create substitution defects therein. Additionally, the ions leave a trail of vacancy defects along paths of propagation in stress-compensation layer 108. The substitution defects and/or vacancies modify (e.g., reduce) stress in stress-compensation layer 108 and can reduce the degree of stress overcorrection caused by the film deposition. This causes the combination of wafer 102 and stress-compensation layer 108 to flatten.

Although, for the sake of specificity, a stress-mitigation beam that is used to modify the stress in stress-compensation layer 108 is referred to as ion beam (e.g., ion beam 112) throughout this disclosure, the stress-mitigation beam can include other matter particles (e.g., electrons), electromagnetic waves (e.g., UV light, visible light, infrared light, etc.), and/or a suitable combination thereof. The stress-mitigation beam strikes stress-compensation layer 108 and changes the bonding network of stress-compensation layer 108. For example, the stress-mitigation beam of low energy may interact with surface atoms of stress-compensation layer 108, e.g., removing some of the surface atoms, effectively implementing etching of surface regions of stress-compensation layer 108. The effectiveness of such etching may be controlled by a choice of ion species/radicals/ambient gasses. In another example, the stress-mitigation beam of high energy can deposit ions inside stress-compensation layer 108. Ions and/or photons can break bonds of the bonding network (or crystal lattice) of stress-compensation layer 108 forming vacancies therein, and can further cause annealing due to local heating, UV curing, and/or other effects.

In some embodiments, the number of ions $\Delta N_i$ deposited per small area $\Delta A=\Delta x\Delta y$ of the wafer may be determined using simulations (performed as described in more detail below) based on the local value of the corrected deformation $h_{corr}(r, \phi)$, which may include a saddle deformation, a residual deformation, and the part of the paraboloid bow deformation $A_{corr}(d)+A_4$ that has been overcorrected by the deposition of stress-compensation layer 108. The desired local density $\Delta N_i/\Delta x\Delta y$ of the ions can be delivered by controlling the scanning velocity v of ion beam 112. In some embodiments, ion beam 112 has a profile that can be approximated with a Gaussian function, e.g., the ion flux $j(\rho)=j_0 \exp(-x^2/a^2-y^2/b^2)$, where x and y are Cartesian coordinates, $j_0$ is the maximum ion flux at the center of the beam, and a and b is are characteristic spreads of the beam along the x-axis and y-axis, respectively. Correspondingly, a point that is located at distance y from the path of the center of the beam receives an ion dose that includes the following number of ions:

$$\frac{\Delta N_i}{\Delta x\Delta y} = \frac{j_0}{v}\int_{-\infty}^{\infty} dx e^{-x^2/a^2-y^2/b^2} = \frac{j_0\sqrt{\pi}}{va}e^{-y^2/b^2}.$$

Correspondingly, by reducing the scanning velocity v, the number of ions received by various regions of stress-compensation layer 108 can be increased, and vice versa. Additionally, ion beam 112 can perform multiple scans with different offsets y so that various points of stress-compensation layer 108 receive multiple doses of ions with different factors $e^{-y^2/b^2}$ that can average to a target dose. For example, after n passes of ion beam implanter 110, each made with a respective velocity $v_k$ at a different distance $y_k$ from the center of ion beam 112 to the area $\Delta x\Delta y$, the total dose of ions received by this area will be $$\left.\frac{\Delta N_i}{\Delta x\Delta y}\right|_{total} = j_0\sqrt{\pi}\sum_{k=1}^{n}\frac{e^{-y_k^2/b^2}}{av_k}.$$

Figure 1E:
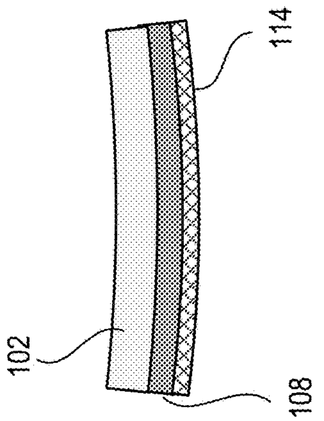

As illustrated in FIG. 1E, an implantation layer 114 formed as part of stress-compensation layer 108 results in a significant mitigation of deformation of wafer 102, and in particular its saddle and residual portions.

Figure 3:
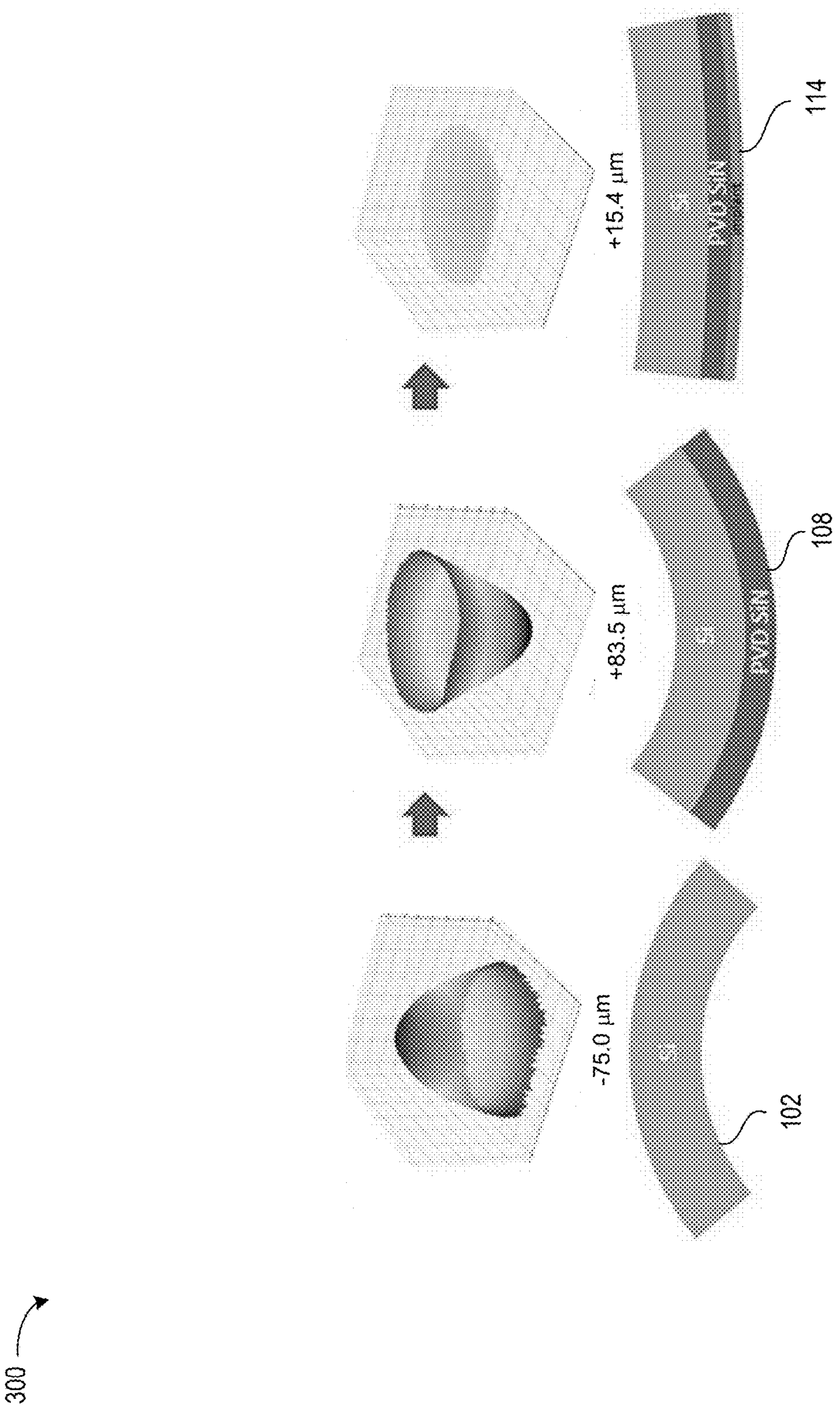
FIG. 3 illustrates stress and deformation mitigation in one example wafer using the process disclosed in relation to FIGS. 1A-E, according to at least one embodiment.
Figure 4:
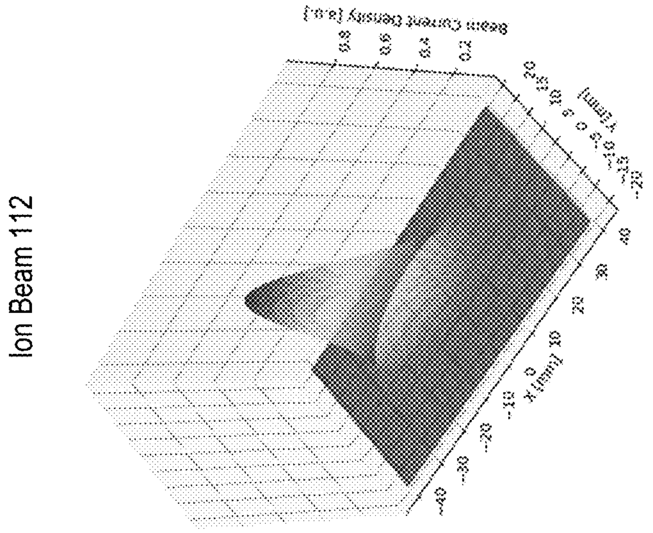
FIG. 4 illustrates one example profile of a Gaussian ion beam that can be used for stress and deformation mitigation in wafers, according to at least one embodiment.

FIG. 3 illustrates stress and deformation mitigation 300 in one example wafer using the process disclosed in relation to FIGS. 1A-E, according to at least one embodiment. As depicted in FIG. 3, a 30 cm Silicon wafer 102 with the maximum negative deformation of −75.0 μm is first overcorrected to the maximum deformation of +83.5 μm using a Silicon Nitride tensile stress-compensation layer 108. The stresses in stress-compensation layer 108 are then reduced by the formation of implantation layer 114 with an ion beam, resulting in a final maximum deformation of +15.4 μm. FIG. 4 illustrates one example profile 400 of a Gaussian ion beam 112 that can be used for stress and deformation mitigation in wafers, according to at least one embodiment.

The techniques of strain and deformation mitigation illustrated in FIGS. 1-3 can also be applied to a wafer having a complex deformation in which stress tensor components $\sigma_{xx}$ and $\sigma_{yy}$ have different signs causing the wafer to have a saddle deformation. FIG. 5 illustrates an example wafer 500 (e.g., a silicon wafer with a Silicon Nitride film deposited thereon) having a saddle-shaped deformation, according to at least one embodiment. As seen in the cross-sectional xz view 502, the stress component $\sigma_{xx}$ may be lower in the wafer (the top layer) than in the film (the bottom layer) deposited on the back side of the wafer. Conversely, as illustrated with the cross-sectional yz view 504, the stress component $\Gamma_{yy}$ may be higher in the wafer than in the film. In some embodiments, the state of stress in the wafer may be represented by the location-dependent stress tensor which may be approximated as, $$\sigma(x, y) = \begin{pmatrix} \sigma_{xx} & \sigma_{xy} & \sigma_{xz} \\ \sigma_{yx} & \sigma_{yy} & \sigma_{yz} \\ \sigma_{zx} & \sigma_{zy} & \sigma_{zz} \end{pmatrix} \approx \begin{pmatrix} \sigma_{xx} & 0 & 0 \\ 0 & \sigma_{yy} & 0 \\ 0 & 0 & 0 \end{pmatrix}.$$

This structure of the stress tensor is usually a good approximation since the wafer is typically in a state of pure bending and independent of the shear stresses that are represented by the off-diagonal terms in the stress tensor. Correction of the saddle shape requires special handling in the computation of the dose map and optimization to ensure that additional residual terms are not introduced into the wafer as a result.

Figure 6A:
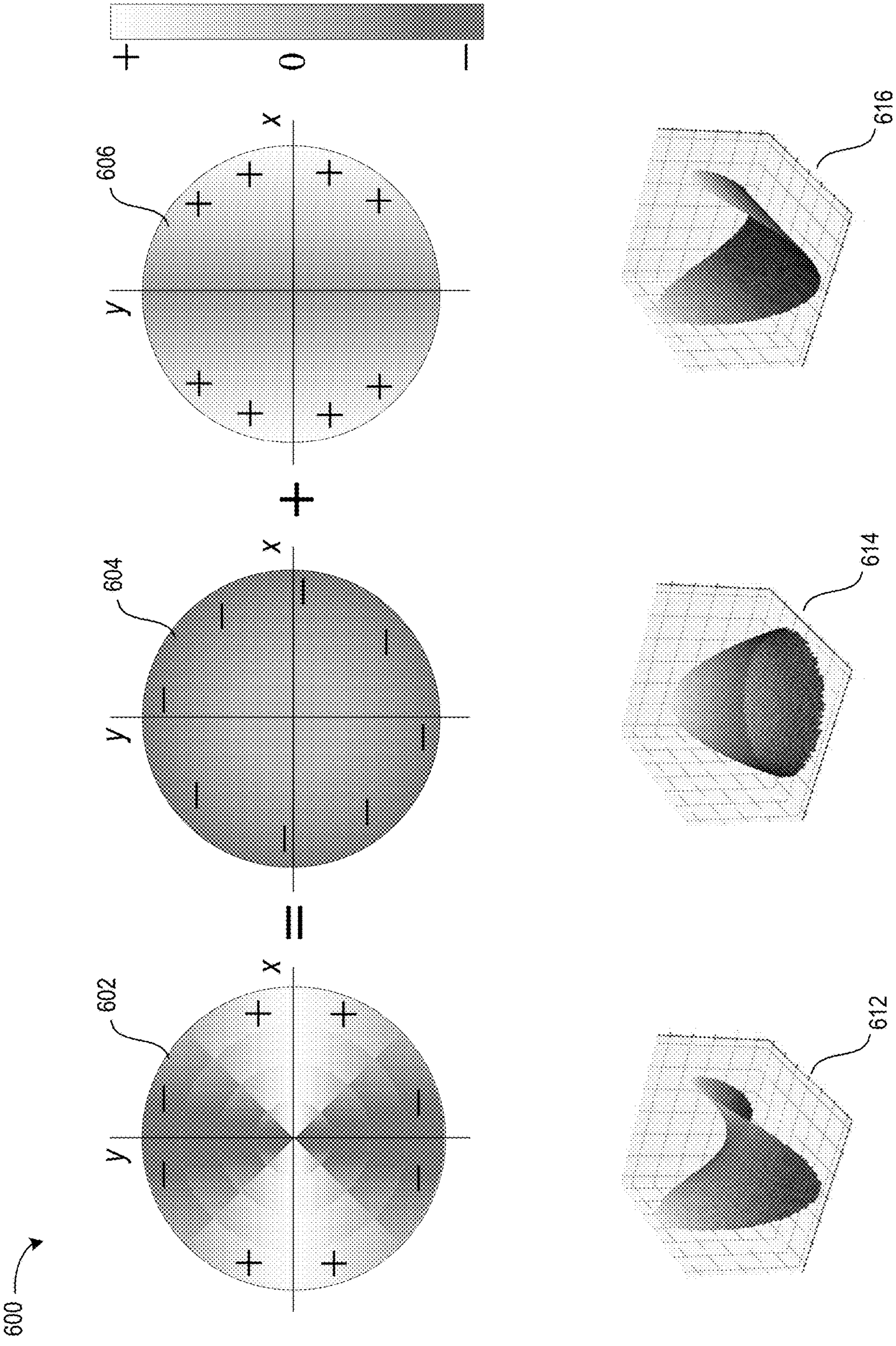
FIG. 6A illustrates an example positive-cylinder decomposition of a quadratic portion of a wafer deformation, according to at least one embodiment.

FIG. 6A illustrates an example positive-cylinder decomposition 600 of a quadratic portion of a wafer deformation, according to at least one embodiment. As described above, deformation of a wafer can be decomposed over Zernike polynomials, e.g., as (omitting a constant shift term in $Z_4$), $$h(r, \phi) = A_4 \cdot 2\sqrt{3}\, r^2 + A_5 \cdot \sqrt{6}\, r^2 \sin 2\phi + A_6 \cdot \sqrt{6}\, r^2 \cos 2\phi + h_{res}(r, \phi),$$

where $Z_7$ and the higher-order terms are included in a residual contribution $h_{res}$ (r, ϕ), which are henceforth omitted, for brevity and conciseness. In an equivalent form, the wafer's deformation can be represented as, $$h_{quad}(r, \phi) = A_4 \cdot 2\sqrt{3}\, r^2 + \sqrt{A_5^2 + A_6^2} \cdot \sqrt{6}\, r^2 \cos(2\phi - 2\phi_0),$$

where $2\phi_0 = \tan^{-1}(A_5/A_6)$. Value $\phi_0$ is the azimuthal angle of a direction of the steepest ascent or descent of the saddle portion of h(r, ϕ), which is made of the combination of the $Z_5$-saddle and the $Z_6$-saddle. Angle $\phi_0$ can be between −ϕ/4 and π/4.

A cylindrically-deformed shape is characterized by the following deformation, $$h_{cyl}(r, \phi) = \beta \cdot r^2 \cos^2(\phi - \phi_0),$$

where the sign of parameter β determines whether the cylinder is upward-facing (β>0) or downward-facing (β<0), the magnitude of β determines the radius of the cylinder's curvature, $R_{curv} = (2|\beta|)^{-1}$, and $\phi_0$ (varying within the [0, π) interval of values) determines the direction (within the xy-plane) along which the wafer is curved; this direction is perpendicular to the cylinder's axis (angles ϕ and $\phi_0$ are being counted from the x-axis). Correspondingly, an arbitrary quadratic wafer deformation $h_{quad}$ (r, ϕ) can be decomposed into a combination of a parabolic bow $h_{par}(r) = \alpha \cdot r^2$ and a positive cylindric ($\beta_+ > 0$) deformation $h_{cyl}(r, \phi)$:

$$h_{quad}(r, \phi) = \alpha_+ \cdot r^2 + \beta_+ \cdot r^2 \cos^2(\phi - \phi_+).$$

The coefficients $\alpha_+$ and $\beta_+$ are found from matching the Zernike decomposition of $h_{quad}$(r, ϕ):

$$\alpha_+ = A_4 \cdot 2\sqrt{3} - \sqrt{A_5^2 + A_6^2} \cdot \sqrt{6},$$

$$\beta_+ = \sqrt{A_5^2 + A_6^2} \cdot 2\sqrt{6},\ \phi_+ = \frac{1}{2}\tan^{-1}(A_5/A_6)$$

Coefficient $\alpha_+$ can be either positive or negative, depending on the sign and magnitude of coefficient $A_4$.

Example 600 of FIG. 6A illustrates a deformation 602 of a wafer having a saddle-shape component with $\phi_0 = 0$ and no parabolic bow component ($A_4 = 0$), for conciseness and ease of viewing. Also shown in FIG. 6A is a three-dimensional (3D) view 612 of deformation 602. As disclosed above, deformation 602 can be decomposed into a negative parabolic deformation 604 (3D view 614) and a positive cylindric deformation 606 (3D view 616). Positive cylindric deformation 606 has a minimum along the y-axis.

Alternatively, the same deformation $h_{quad}$ (r, ϕ) can be decomposed into a combination of a parabolic bow $h_{par}(r) = \alpha_- \cdot r^2$ and a negative cylindric deformation:

$$h(r, \phi) = \alpha_- \cdot r^2 - \beta_- \cdot r^2 \cos^2(\phi - \phi_-).$$

The coefficients $\alpha_-$ and $\beta_-$ are then found to be:

$$\alpha_- = A_4 \cdot 2\sqrt{3} + \sqrt{A_5^2 + A_6^2} \cdot \sqrt{6},$$

$$\beta_- = \sqrt{A_5^2 + A_6^2} \cdot 2\sqrt{6},\ \phi_- = \frac{1}{2}\tan^{-1}(A_5/A_6) - \frac{\pi}{2}\mathrm{sign}(A_5/A_6).$$

Coefficient $\alpha_-$ can be either positive or negative, depending on the sign and magnitude of coefficient $A_4$.

Figure 6B:
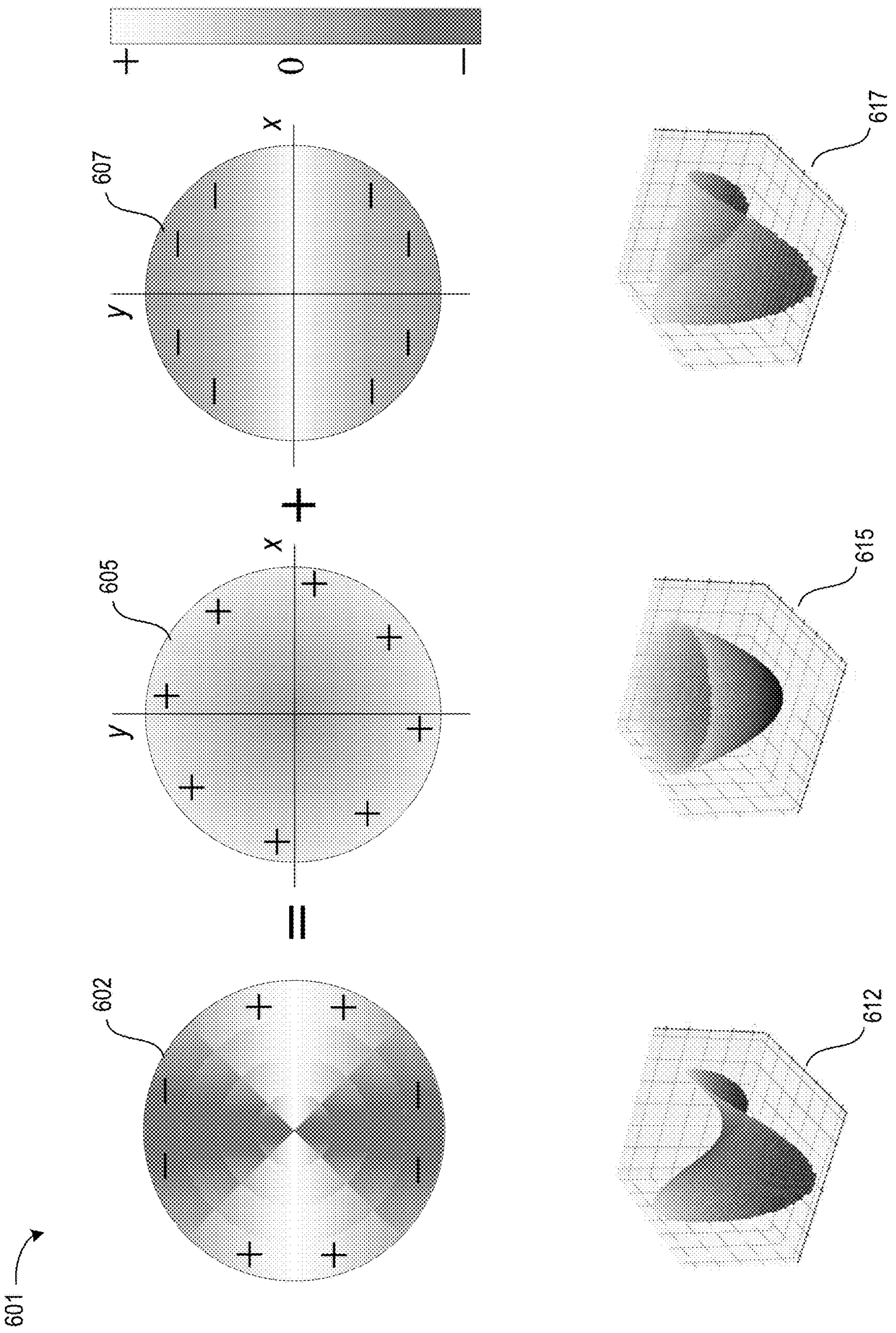
FIG. 6B illustrates an example negative-cylinder decomposition of a quadratic portion of a wafer deformation, according to at least one embodiment.

FIG. 6B illustrates an example negative-cylinder decomposition 601 of a quadratic portion of a wafer deformation, according to at least one embodiment. Decomposition 601 of FIG. 6B represents deformation 602 as a sum of a positive parabolic deformation 605 (3D view 615) and a negative cylindric deformation 607 (3D view 617). Absolute value of negative cylindric deformation 607 has a maximum along the x-axis.

In the instances of wafers with arbitrary parabolic bows and arbitrary saddle orientations, both the positive cylinder decomposition (described by parameters $\alpha_+$, $\beta_+$, and $\phi_+$ identified above) and the negative cylinder decomposition (parameters $\alpha_-$, $\beta_-$, and $\phi_-$) can be evaluated. A more optimal decomposition can then be selected. Since for both decompositions $\beta_+ = \beta_{31}$, the selection can include identifying a decomposition that has the smaller value of |α|). For example, once a decomposition with the smaller |α| is selected, the sign of a can be evaluated. If α>0 (indicative of a positive bow), a tensile stress-compensation film that compresses the wafer's back surface can be selected. Conversely, if α<0 (indicative of a negative bow), a compressive stress-compensation film that stretches the wafer's back surface can be selected. In some embodiments, a certain type of film can be preferred, e.g., a tensile film can be preferred over a compressive film (or vice versa). In such instances, a decomposition with the corresponding sign of $\alpha$ can be selected, if $\alpha$ of such a sign is available. (If both $\alpha_+$ and $\alpha_-$ are of the same sign, the decomposition with the smaller value can be preferred.)

In some embodiments, the strength of the stress-compensation film can be selected based on both $\alpha$ and $\beta$. For reasons discussed above, it can be advantageous to ensure the same sign of the film-corrected deformation of the wafer. For example, if the film of a certain type and thickness d causes the deformation of the wafer to be modified by $\gamma$(type, d)·$r^2$, the total corrected deformation of the wafer after the film deposition can be $$h_{corr}(r,\phi)=\alpha_+\cdot r^2+\beta_+\cdot r^2\cos^2\phi+\gamma(\text{type},d)\cdot r^2.$$

In one example, if a wafer has a negative parabolic bow deformation $\alpha_+<0$ and it has been determined that the film is to be of the type that causes stretching of the back surface of the wafer, $\gamma$(type, d)>0, the thickness of the film can be selected such that, $$\gamma(\text{type},d)\geq|\alpha_+|,$$

to ensure that film-corrected deformation $h_{corr}$ (r, $\phi$) for the entire area of the back surface of the wafer. In particular, if a film is selected such that $\gamma$(type, d)=|$\alpha_+$|, the wafer's deformation will corrected to zero along the y-axis (=±$\pi$/2) and overcorrected by $\beta_+\cdot r^2\cos^2\phi$ along other lines, with the maximum overcorrection occurring along the x-axis ($\phi$=0, $\pi$). The overcorrection can then be addressed by targeted ion implantation that relaxes strain in the stress-compensation film, e.g., with the maximum implantation of ions occurring near points (x,y)=(±R, 0) and the minimum ion implantation occurring near points (0, ±R), where R is the radius of the wafer.

In some embodiments, quadratic deformation of a wafer can be characterized quantitatively by a degree to which a parabolic deformation and a cylindric deformation coexist. In one non-limiting embodiment, a "cylindric" polynomial can be introduced (with the same normalization as the Zernike polynomials), $$Z_{cyl}(r,\phi)=2\sqrt{2}\,r^2\cos^2\phi,$$

so that the quadratic deformation can be represented as $$h_{quad}(r,\phi)=\left(A_4-\frac{1}{\sqrt{2}}\sqrt{A_5^2+A_6^2}\right)\cdot Z_4(r)+\sqrt{3}\sqrt{A_5^2+A_6^2}\cdot Z_{cyl}(r,\phi-\phi_0),$$

Correspondingly, the value $$P=\frac{|A_4-\frac{1}{\sqrt{2}}\sqrt{A_5^2+A_6^2}|}{|A_4-\frac{1}{\sqrt{2}}\sqrt{A_5^2+A_6^2}|+\sqrt{3}\sqrt{A_5^2+A_6^2}}$$

can be referred to as the parabolicity of the wafer while the value $$C=1-P=\frac{\sqrt{3}\sqrt{A_5^2+A_6^2}}{|A_4-\frac{1}{\sqrt{2}}\sqrt{A_5^2+A_6^2}|+\sqrt{3}\sqrt{A_5^2+A_6^2}}$$

can be referred to as the cylindricity of the wafer. In some embodiments, a type and thickness of the stress-compensation film can be determined directly from the parabolicity P, cylindricity C, and/or from the ratio P:C.

Figure 7:
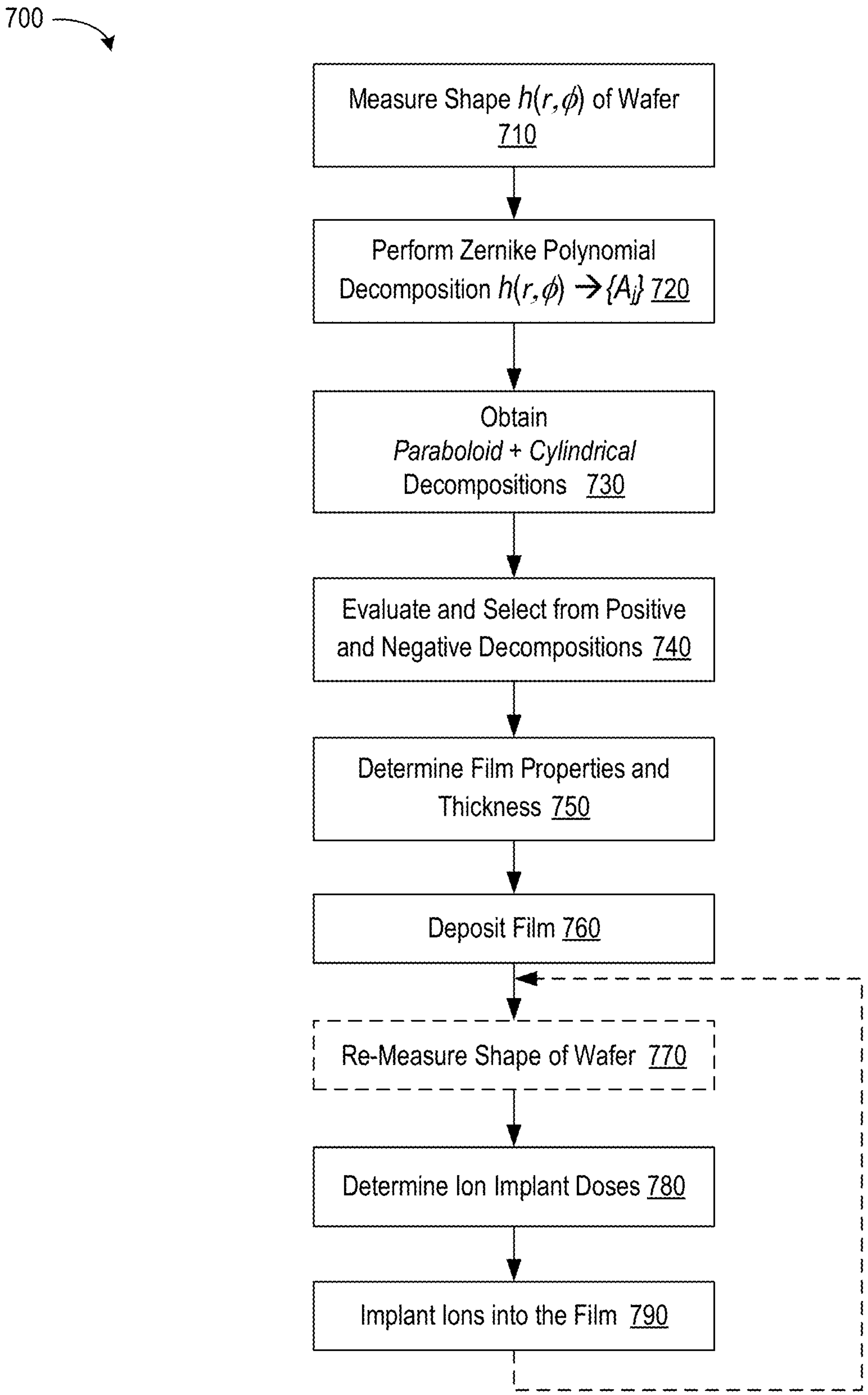
FIG. 7 is a flowchart illustrating an example process of mitigation of deformations of wafers using cylindric decomposition, according to at least one embodiment.

FIG. 7 is a flowchart illustrating an example process 700 of mitigation of deformations of wafers using cylindric decomposition, according to at least one embodiment. Process 700 can be performed using a semiconductor manufacturing system that includes one or more processing chambers, e.g., deposition chamber(s), plasma chamber(s), etching chamber(s), polishing chamber(s), film removal chamber(s), beam irradiation chamber(s), optical inspection chamber(s), and/or the like. The processing chambers can be connected to one or more transfer chambers, which can be equipped with robot(s) to handle wafers, e.g., moving wafers into and out of processing chambers. The transfer chamber can further be connected to a load-lock chamber (Front-End Interface) that can be coupled to one or more Front Opening Unified Pod carriers that hold bare wafers, processed wafers, partially processed wafers, and/or the like. Operations performed by the semiconductor manufacturing system, including any, some or all operations of process 700, can be performed responsive to instructions issued by a suitable computing device having a processing logic and memory to store the instructions.

At block 710, process 700 includes measuring a shape of a wafer, e.g., a displacement of a surface (e.g., top surface of back surface) of a wafer as a function of any suitable in-plane coordinates, e.g., polar coordinates, h(r, $\phi$), Cartesian coordinates, h(x,y), or some other coordinates. At block 720, process 700 includes representing the determined shape via a suitable set of polynomials, e.g., Zernike polynomials, and obtaining a set of polynomial expansion coefficients, $\{A_j\}=(A_1, A_2, A_3), A_4, A_5, A_6, A_7 \ldots$, each coefficient in the set characterizing a degree of presence of a particular elemental geometric shape in the wafer's deformation.

At block 730, the coefficients $\{A_j\}$ can be used to obtain a decomposition of the wafer's deformation as a sum of at least a parabolic deformation and a cylindric deformation, e.g., as disclosed in more detail above. The obtained cylindric decompositions can include a positive cylindric decomposition and a negative cylindric decomposition. At block 740, the obtained cylindric decompositions can be evaluated and a preferred cylindric decomposition can be selected for embodiment via a film deposition. The preferred cylindric decomposition can be selected based on a variety of metrics. For example, a cylindric decomposition that calls for a minimum corrective parabolic bow (that still makes stress to have the same sign throughout the area of the wafer) may be selected; a cylindric decomposition that calls for a particular type of a film (e.g., a tensile film or a compressive film) can be selected; a cylindric decomposition that is most aligned (or misaligned) with specific features patterned on the top side of the wafer can be selected; and/or the like.

At block 750, process 700 can continue with identifying properties (e.g., a type of material, thickness, etc.) of a target stress-compensation layer (film) to be deposited on the wafer. At block 760, process 700 can include depositing the film made of the selected material and having a selected thickness on the wafer. The deposited film can make the stress tensor in the new wafer+film structure of a certain sign (positive or negative). This is advantageous since subsequent ion implantation can reduce the amount of stress in the film whereas reversing the sign of the stress in the film (e.g., turning a tensile film into a compressive film) with ion implantation may be more difficult.

At block 780, process 700 can continue with determining appropriate doses for ion (electron, photon, etc.) implantation. In some embodiments, ion implantation doses can be determined based on the saddle component of the wafer deformation that has not been eliminated by the film deposition (and/or a remaining parabolic component), e.g., as given by the coefficient β of the selected and applied cylindric decomposition, a suitable combination of Zernike coefficients (e.g., $$\sqrt{A_5^2 + A_6^2}),$$

and/or the like. In some embodiments, ion implantation doses can further be selected to eliminate (or reduce) a higher-order residual deformation.

In some embodiments, operations of block 780 can be performed based on the wafer deformation data acquired at block 710 prior to film deposition. In some embodiments, operations of block 780 can be performed based on new data obtained after film deposition by re-measuring (block 770) the corrected (by the film) deformation of the wafer. At block 790, ion implantation is performed, e.g., by exposing the film to a stress-mitigation beam (e.g., ion beam), as disclosed in conjunction with FIGS. 8A-B below. As indicated by the dashed arrow in FIG. 7, blocks 770-790 of process 700 can be repeated iteratively until stress or deformation of the wafer is reduced below a target tolerance.

Figure 8A:
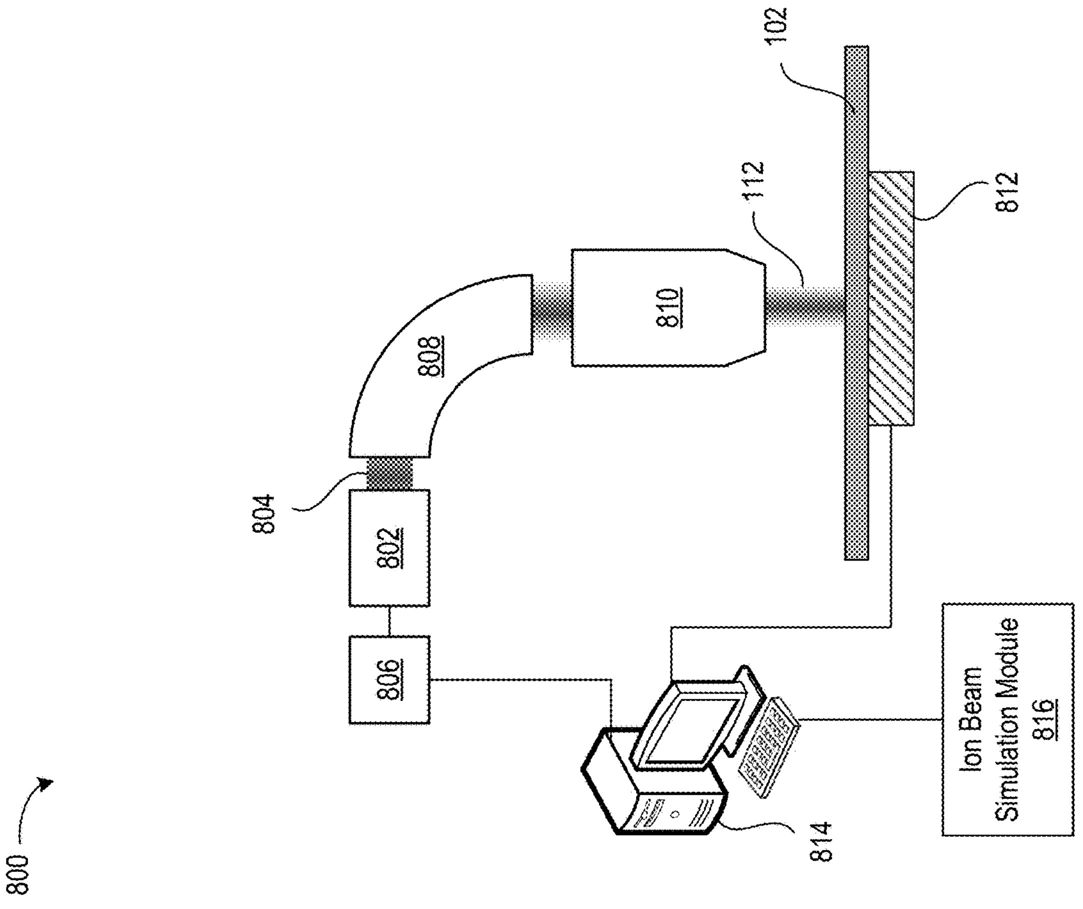
FIG. 8A illustrates schematically an ion implantation system capable of performing ion implantation into stress-compensation layers, according to at least one embodiment.

FIG. 8A illustrates schematically an ion implantation system 800 capable of performing ion implantation into stress-compensation layers, according to at least one embodiment. Ion implantation system 800 can be or include ion beam implanter 110 of FIG. 1. Although, for the sake of specificity, a stress-mitigation beam that is used to modify the stress in a stress-compensation layer 108 is referred to as ion beam (e.g., ion beam 112), in some embodiments, the stress-mitigation beam can include other matter particles (e.g., electrons), electromagnetic waves (e.g., UV light, visible light, infrared light, etc.), and/or a suitable combination thereof. Ion implantation system 800 can include an ion source 802 for producing an ion beam 804. Ion source 802 can include a chamber for generating ions (e.g., a plasma chamber). Ion source 802 can be powered by a power source 806 and can include an extraction electrode assembly (not shown). Ion implantation system 800 can include a mass spectrometer 808 and a collimating and focusing column 810. Collimating and focusing column 810 can direct ion beam 112 to wafer 102. Wafer 102 can be supported by a support stage 812. In some embodiments, support stage 812 and wafer 102 can remain stationary during scanning of wafer 102 by ion beam 112 while components of ion implantation system 800 can be repositioned relative to wafer 102. In some embodiments, ion implantation system 800 can be stationary while support stage 812 can reposition wafer 102. Scanning with ion beam 112 can occur along multiple directions, e.g., along x-axis and along y-axis according to any suitable predetermined pattern, e.g., back-and forth along x-axis, in a spiral pattern, and so on. In various embodiments, ion beam 112 can be scanned at a frequency of several Hz, tens of Hz, hundreds of Hz, thousands of Hz, or more.

Figure 8B:
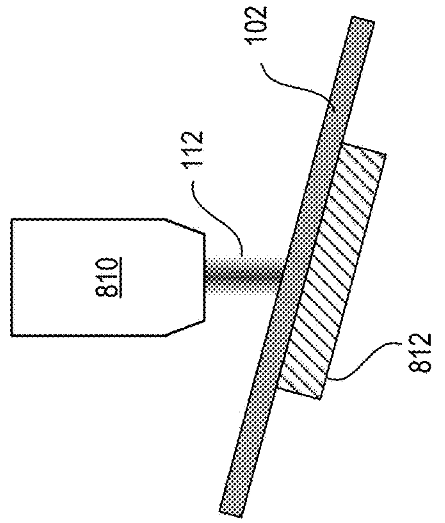
FIG. 8B illustrates a delivery of ions to a wafer at an arbitrary angle of incidence by the ion implantation system of FIG. 8A, according to at least one embodiment.

Operations of ion implantation system 800 can be controlled by a controller 814, which can include any suitable computing device, microcontroller, or any other processing device having a processor, e.g., a central processing unit (CPU), a field-programmable gate array (FPGA), an application-specific integrated circuit (ASIC), and/or the like, and a memory device, e.g., a random-access memory (RAM), read-only memory (ROM), flash memory, and/or the like or any combination thereof. Controller 814 can control operations of power source 806, support stage 812, and/or various other components and modules of ion implantation system 800. Controller 814 can include an ion beam simulation module 816 capable of performing simulations that determine a target intensity of ion beam 112 to be used to mitigate various wafer deformations. In some embodiments, support stage 812 can impart a tilt, e.g., in one or two spatial directions to wafer 102 to change an angle of incidence of ion beam 112 relative to wafer 102. In some embodiments, instead of tilting wafer 102, controller 814 can cause a tilt of ion implantation system 800 relative to wafer 102. In some embodiments, e.g., as illustrated in FIG. 8B, support stage 812 can impart a tilt, e.g., in one or two spatial directions to wafer 102 to change an angle of incidence of ion beam 112 relative to wafer 102. In some embodiments, instead of tilting wafer 102, controller 814 can cause a tilt of ion implantation system 800 relative to wafer 102.

Figure 9:
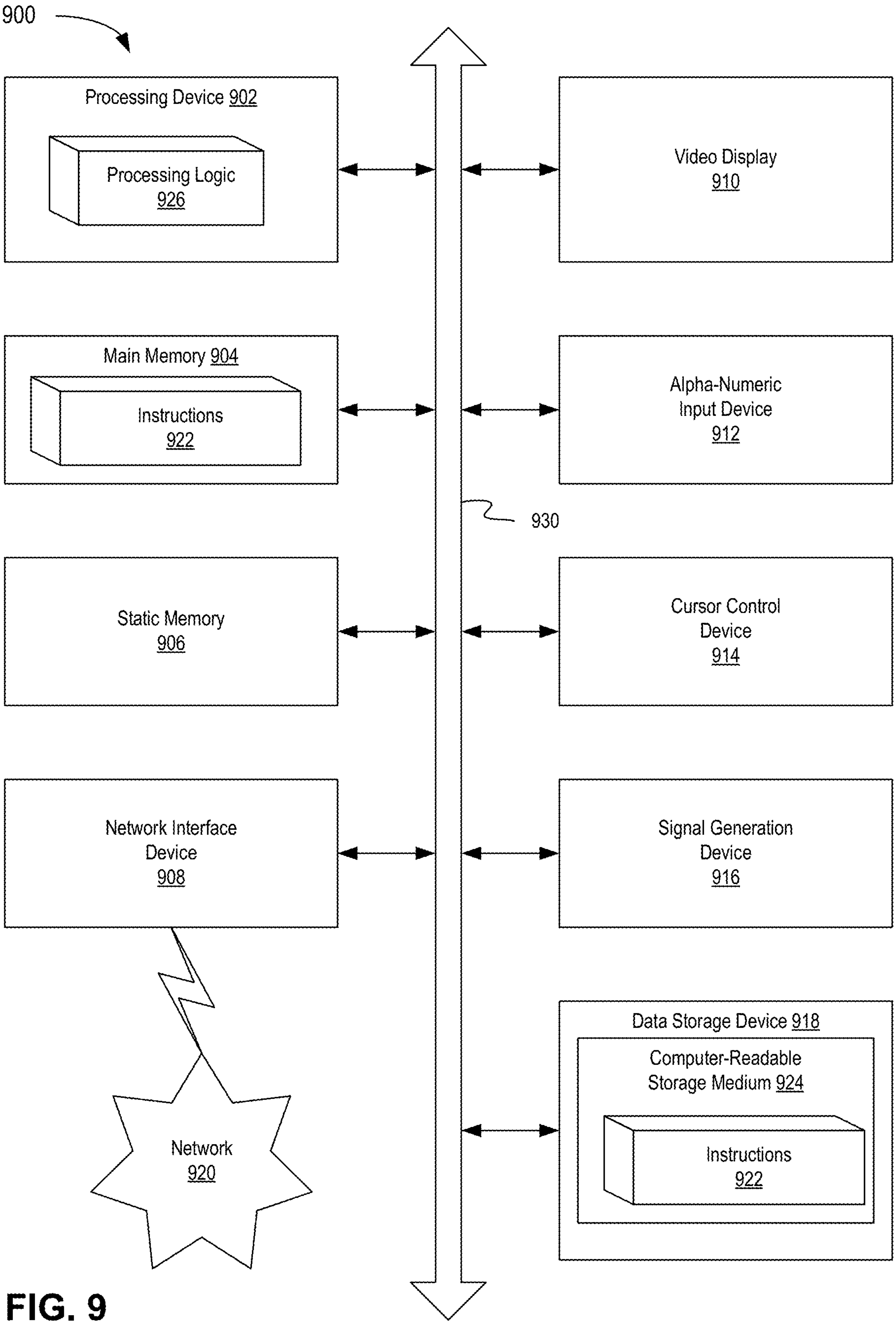
FIG. 9 depicts a block diagram of an example computer system capable of supporting operations of the present disclosure, according to at least one embodiment.

FIG. 9 depicts a block diagram of an example computer system 900 capable of supporting operations of the present disclosure, according to at least one embodiment. In various illustrative examples, example computer system 900 may be or include controller 814 of FIG. 8. Example computer system 900 may be connected to other computer systems in a LAN, an intranet, an extranet, and/or the Internet. Computer system 900 may operate in the capacity of a server in a client-server network environment. Computer system 900 may be a personal computer (PC), a set-top box (STB), a server, a network router, switch or bridge, or any device capable of executing a set of instructions (sequential or otherwise) that specify actions to be taken by that device. Further, while only a single example computer system is illustrated, the term “computer” shall also be taken to include any collection of computers that individually or jointly execute a set (or multiple sets) of instructions to perform any one or more of the methods discussed herein.

Example computer system 900 may include a processing device 902 (also referred to as a processor or CPU), which may include processing logic 926, a main memory 904 (e.g., read-only memory (ROM), flash memory, dynamic random access memory (DRAM) such as synchronous DRAM (SDRAM), etc.), a static memory 906 (e.g., flash memory, static random access memory (SRAM), etc.), and a secondary memory (e.g., a data storage device 918), which may communicate with each other via a bus 930.

Processing device 902 represents one or more general-purpose processing devices such as a microprocessor, central processing unit, or the like. More particularly, processing device 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 902 may be configured to execute instructions implementing example process 700 of mitigation of deformations of wafers using cylindric decomposition.

Example computer system 900 may further comprise a network interface device 908, which may be communicatively coupled to a network 920. Example computer system 900 may further comprise a video display 910 (e.g., a liquid crystal display (LCD), a touch screen, or a cathode ray tube (CRT)), an alphanumeric input device 912 (e.g., a keyboard), a cursor control device 914 (e.g., a mouse), and an acoustic signal generation device 916 (e.g., a speaker).

Data storage device 918 may include a computer-readable storage medium (or, more specifically, a non-transitory computer-readable storage medium) 924 on which is stored one or more sets of executable instructions 922. In accordance with one or more aspects of the present disclosure, executable instructions 922 may comprise executable instructions implementing example process 700 of mitigation of deformations of wafers using cylindric decomposition.

Executable instructions 922 may also reside, completely or at least partially, within main memory 904 and/or within processing device 902 during execution thereof by example computer system 900, main memory 904 and processing device 902 also constituting computer-readable storage media. Executable instructions 922 may further be transmitted or received over a network via network interface device 908.

While the computer-readable storage medium 924 is shown in FIG. 9 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other embodiment examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method to correct an out-of-plane deformation (OPD) of a substrate, the method comprising:

obtaining, using optical inspection data, an OPD profile of the substrate;

obtaining a polynomial representation of the OPD profile to determine a plurality of polynomial coefficients, each of the plurality of polynomial coefficients characterizing a respective one of a plurality of elemental deformation shapes of the substrate;

identifying, based on at least a subset of the plurality of polynomial coefficients, one or more cylindric decompositions of a quadratic part of the OPD profile, wherein each of the one or more cylindric decompositions comprises a decomposition of the OPD profile into at least a parabolic deformation of the substrate and a cylindric deformation of the substrate;

computing, using a selected cylindric decomposition of the one or more cylindric decompositions, one or more characteristics of a stress-compensation layer (SCL) for the substrate;

causing the SCL to be deposited on the substrate; and exposing the SCL to a stress-mitigation beam.

2. The method of claim 1, wherein the polynomial representation of the OPD profile comprises an expansion of the OPD profile over Zernike polynomials.

3. The method of claim 1, wherein the one or more cylindric decompositions comprise:

a first cylindric decomposition comprising an upward-facing cylindric contribution to the OPD of the substrate; and a second cylindric decomposition comprising a downward-facing cylindric contribution to the OPD of the substrate.

4. The method of claim 3, wherein the selected cylindric decomposition comprises a parabolic contribution to the OPD of the substrate having a lower magnitude among parabolic contributions to the OPD of the one or more cylindric decompositions.

5. The method of claim 3, wherein the selected cylindric decomposition is associated with a direction of patterning of the substrate.

6. The method of claim 1, wherein the one or more characteristics of the SCL are computed to cause a stress in the substrate to have a same sign throughout an area of the substrate.

7. The method of claim 1, wherein the one or more characteristics of the SCL comprise one or more of:

a material of the SCL, or a thickness of the SCL.

8. The method of claim 1, wherein settings of the stress-mitigation beam comprise one or more of:

a type of particles of the stress-mitigation beam, an energy of the particles of the stress-mitigation beam, or an angle of incidence of the particles of the stress-mitigation beam on the SCL.

9. The method of claim 1, further comprising:

responsive to exposing the SCL to the stress-mitigation beam, obtaining an updated OPD profile of the substrate;

mapping, based on the updated OPD profile, a residual stress in the substrate;

identifying, based on the mapped residual stress, settings for an additional stress-mitigation beam; and exposing one or more regions of the SCL to the additional stress-mitigation beam.

10. The method of claim 1, wherein the substrate comprises a front side and a back side, wherein the front side comprises one or more manufactured features, and wherein the SCL is deposited on the back side of the substrate.

11. A system comprising:

a memory; and a processing device communicatively coupled to the memory, the processing device to:

obtain, using optical inspection data, an out-of-plane deformation (OPD) profile of a substrate;

obtain a polynomial representation of the OPD profile to determine a plurality of polynomial coefficients, each of the plurality of polynomial coefficients characterizing a respective one of a plurality of elemental deformation shapes of the substrate;

identify, based on at least a subset of the plurality of polynomial coefficients, one or more cylindric decompositions of a quadratic part of the OPD profile, wherein each of the one or more cylindric decompositions comprises a decomposition of the OPD profile into at least a parabolic deformation of the substrate and a cylindric deformation of the substrate;

compute, using a selected cylindric decomposition of the one or more cylindric decompositions, one or more characteristics of a stress-compensation layer (SCL) for the substrate;

cause the SCL to be deposited on the substrate; and cause the SCL to be exposed to a stress-mitigation beam.

12. The system of claim 11, wherein the polynomial representation of the OPD profile comprises an expansion of the OPD profile over Zernike polynomials.

13. The system of claim 11, wherein the one or more cylindric decompositions comprise:

a first cylindric decomposition comprising an upward-facing cylindric contribution to the OPD of the substrate; and a second cylindric decomposition comprising a downward-facing cylindric contribution to the OPD of the substrate.

14. The system of claim 13, wherein the selected cylindric decomposition comprises a parabolic contribution to the OPD of the substrate having a lower magnitude among parabolic contributions to the OPD of the one or more cylindric decompositions.

15. The system of claim 13, wherein the selected cylindric decomposition is associated with a direction of patterning of the substrate.

16. The system of claim 11, wherein the one or more characteristics of the SCL are computed to cause a stress in the substrate to have a same sign throughout an area of the substrate.

17. The system of claim 11, wherein the one or more characteristics of the SCL comprise one or more of:

a material of the SCL, or a thickness of the SCL; and wherein settings of the stress-mitigation beam comprise one or more of:

a type of particles of the stress-mitigation beam, an energy of the particles of the stress-mitigation beam, or an angle of incidence of the particles of the stress-mitigation beam on the SCL.

18. The system of claim 11, wherein the processing device is further to:

responsive to exposing the SCL to the stress-mitigation beam, obtain an updated OPD profile of the substrate;

map, based on the updated OPD profile, a residual stress in the substrate;

identify, based on the mapped residual stress, settings for an additional stress-mitigation beam; and cause one or more regions of the SCL to be exposed to the additional stress-mitigation beam.

19. The system of claim 11, wherein the substrate comprises a front side and a back side, wherein the front side comprises one or more manufactured features, and wherein the SCL is deposited on the back side of the substrate.

20. A semiconductor manufacturing system comprising:

one or more processing chambers to process a substrate; and a computing device to:

obtain, using optical inspection data, an out-of-plane deformation (OPD) profile of the substrate;

obtain a polynomial representation of the OPD profile to determine a plurality of polynomial coefficients, each of the plurality of polynomial coefficients characterizing a respective one of a plurality of elemental deformation shapes of the substrate;

identify, based on at least a subset of the plurality of polynomial coefficients, one or more cylindric decompositions of a quadratic part of the OPD profile, wherein each of the one or more cylindric decompositions comprises a decomposition of the OPD profile into at least a parabolic deformation of the substrate and a cylindric deformation of the substrate;

compute, using a selected cylindric decomposition of the one or more cylindric decompositions, one or more characteristics of a stress-compensation layer (SCL) for the substrate;

cause the SCL to be deposited on the substrate; and cause the SCL to be exposed to a stress-mitigation beam.

* * * * *